United States Patent [19]

Oae et al.

[11] Patent Number: 5,117,117
[45] Date of Patent: May 26, 1992

[54] ELECTRON BEAM EXPOSURE SYSTEM HAVING AN IMPROVED SEAL ELEMENT FOR INTERFACING ELECTRIC CONNECTIONS

[75] Inventors: Yoshihisa Oae, Kanagawa; Kiichi Sakamoto, Tokyo; Akio Yamada, Kawasaki, all of Japan

[73] Assignee: Fujitsu Limited, Kawasaki, Japan

[21] Appl. No.: 718,380

[22] Filed: Jun. 20, 1991

[30] Foreign Application Priority Data

Jun. 20, 1990 [JP] Japan .................................. 2-162220

[51] Int. Cl.⁵ ............................................... H01J 3/38
[52] U.S. Cl. ........................ 250/492.2; 250/396 R; 313/477 HC
[58] Field of Search ................ 250/492.2, 396 R, 398; 313/477 HC, 51

[56] References Cited

U.S. PATENT DOCUMENTS 4,661,709 4/1987 Walker et al. .................. 250/396 R
4,701,623 10/1987 Beasley ............................ 250/396 R Primary Examiner—Jack I. Berman
Assistant Examiner—Kiet T. Nguyen
Attorney, Agent, or Firm—Staas & Halsey

[57] ABSTRACT

An electron beam exposure system for writing a pattern on an object by an electron beam comprises a beam source for producing an electron beam, a beam focusing unit for focusing the electron beam on the object, a beam processing unit provided along an optical axis of the electron beam for modifying the electron beam in response to control signals, a column extending along the optical axis of the electron beam so as to surround a region that includes the object, the beam source, the beam focusing unit and the beam processing unit and for maintaining the region evacuated, and an interface element mounted on the column for supplying the control signals to said beam processing unit. The interface element comprises a ring-shaped base body of a ceramic material having first and second major surfaces, the first major surface establishing an hermetic seal to the column when the interface element is mounted thereon, one or more conductor patterns provided on the second major surface so as to extend radially from an inner circumference to an outer circumference, and an insulator film provided on the second major surface of the base body so as to bury the conductor patterns underneath. The insulator film has a substantially flat major surface and establishes an hermetic seal with the column when the interface element is mounted thereon.

10 Claims, 9 Drawing Sheets

ELECTRON BEAM EXPOSURE SYSTEM HAVING AN IMPROVED SEAL ELEMENT FOR INTERFACING ELECTRIC CONNECTIONS

BACKGROUND OF THE INVENTION

The present invention generally relates to electron beam exposure systems, and more particularly to an electron beam exposure system that has a large number of electric connections extending into an evacuated column, in which the electron beam travels, for supplying various signals to the elements provided inside the column.

The electron beam exposure system writes a pattern on an object by a focused electron beam. By using the focused electron beam, one can write a pattern on the object which may be a semiconductor wafer, with a resolution well below 1 $\mu$m.

In order to achieve the object, the electron team exposure system employs electron lenses that produce a very strong magnetic field. Generally, an electron lens having the strength of several hundred to several thousand ampere-turns is employed for focusing the electron beam. Such an electron lens is bulky and occupies a considerable space around the column of the electron beam exposure system.

FIG. 1 shows schematically the general construction of a conventional electron beam exposure system that employs the blanking aperture array system.

Referring to FIG. 1, an electron beam is emitted from an electron gun 30 and travels along a predetermined optical path 64 toward a semiconductor wafer 56. The electron beam 32 is thereby shaped by an aperture 34 and focused by a first electron lens 36. The electron beam 32 is then deflected by an electrostatic deflector 38 for beam alignment and passed through another electron lens 40. In the electron lens 40, the electron beam is shaped into a parallel beam and passed through a blanking aperture array 42.

The blanking aperture array 42 comprises a plate carrying thereon a number of apertures arranged in a row and column formation. Each aperture forms an electrostatic deflector and passes or interrupts the parallel electron beam incident thereto in response to a control signal applied to the electrostatic deflector of the aperture. Thus by passing the electron beam through the blanking aperture array 42, the electron beam is shaped or "patterned" as desired.

The patterned electron beam is then focused by an electron lens 44 and focused on the wafer 56 after passing through the electron lenses 48, 52 and 59. Further, electrostatic deflectors 46 and 62 are provided between the lens 44 and the wafer 56, wherein the electrostatic deflector 46 is used for turning off the electron beam, while the electrostatic deflector 62 is used for deflecting the electron beam on the wafer 56. Further, there are provided adjustment coils 58 and 60 respectively in correspondence to the electron lenses 52 and 59.

In such an electron beam exposure system, it should be noted that a large and bulky coils have to be provided around an evacuated column 100 in which the electron beam passes through. Referring to FIG. 1, coils 36a, 40a, 44a, 48a, 52a and 59a are provided to surround the column 100. It should be noted that the strength of these electron lenses has to be large in order to obtain a satisfactory resolution. When the strength of the electron lens is reduced, the focal length is increased and various problems, like spherical aberrations, chromatic aberrations as well as the problems caused by the coulomb interaction of electrons, may occur.

In order to obtain a strong electron lens, one has to supply a large current to the coils forming the lens, and thereby the size of the electron lens increases inevitably. When the size of the coil is reduced, the heating caused by the large current flowing through thin wires of the coil becomes excessive and the magnetic field formed by the coil becomes unstable. Under such situation, it will be understood that the column 100 is almost entirely surrounded by the coils and little space is available for the interconnection interface to the elements inside the column such as the electrostatic deflectors or adjusting coils. As the column 100 has to be formed by a conductive material, the electrostatic deflectors cannot be provided outside the column 100.

This problem of difficulty in finding the location for the interconnection interface becomes particularly serious in the recently developed electron team exposure systems that employ the blanking aperture array. Such electron beam exposure systems need a large number of interconnection leads for supplying various control signals for patterning the electron beam.

FIG. 2 shows a conventional element 10 used for supplying control signals to the elements provided inside the column 100.

Referring to FIG. 2, the element 10 comprises a ring 12 of a metal and the like, and a number of insulating sleeves 16 are provided in the ring 12 to extend radially. Further, each sleeve 16 includes therein an interconnection lead 20.

FIG. 3 shows the partial cross section of the side view of the element 10. Referring to FIG. 3, the blanking aperture array 42 is provided inside the ring 12 where the array 18 is connected to the leads 20 in the sleeves 16 by respective interconnection wires 22. The ring 22 has upper and lower flanges 22a and 22b in intimate contact with corresponding flange parts 110a and 100b formed in the column 100 and establishes a hermetic seal with the flange surfaces. In this conventional element 10, it will be understood that there is a limitation in the number of leads 20 that can be provided in one element, as the leads cannot be placed closer than the diameter of the sleeve 16. Generally, such a conventional element 10 has a thickness of 20–30 mm and occupies considerable space.

In the conventional type electron exposure system that does not use the blanking aperture array 42, the element 10 is provided generally between the coil 52a for the demagnification lens 52 and the coil 59a for the objective lens 59, for supplying the control signals to the adjusting coil 58 in the lens 52, the adjusting coil 60 in the lens 59, and to the electrostatic deflector 62, as schematically shown in FIG. 1. The placement of the element 10 below the coil 59a is not desirable, as such a construction increases the distance between the objective lens 59 and the wafer 56. Even so, one has to compromise about the resolution in order to provide the element 10.

In the recent electron beam exposure systems that employ the blankinq aperture array it will be understood that another interface element 10 has to be provided in correspondence to where the blanking aperture array is provided. This can only be done by increasing the distance between the electron lens 40 and the electron lens 44 and insert the element 10 into the space thus formed. However, such an increase in the separation between the lenses requires undesirable increase in the focal length of the lenses.

FIGS. 4 and 5 show the blanking aperture array 42 in some detail. Referring to the perspective view of FIG. 4, the blanking aperture array 42 includes a number of apertures 88 arranged in the row and column formation, and each aperture 88 has a pair of electrodes 90 and 93, 91 and 92, . . . as shown in FIG. 5 for deflecting the electron beam passing through the aperture 88. When the electron beam is deflected upon passage through the aperture 88, the electron beam does not reach the wafer 56 while when there is no deflection, a dot pattern corresponding to the aperture 88 is written on the wafer 56. Thus, by suitably driving the electrodes for each aperture 88, one can pattern the electron beam that reaches the wafer 56 as desired.

In order to drive the electrodes of the apertures 88 individually, it is necessary to provide a large number of leads 94, 95, 96, 97, . . . on the body of the blanking aperture array 42 in correspondence to the rows and columns of the apertures 88. This means that a large number of control signals have to be supplied to the blanking aperture array 42 in addition to the control signals to the adjustment coils 58, 60 and the electrostatic deflector 62. Thus, it will be understood that the conventional element 10 is insufficient for supplying the control signals to the electron beam exposure system that uses the blanking aperture array. On the other hand, there is an acute demand for such an electron beam exposure system that uses the blanking aperture array particularly in relation to the fabrication of large capacity semiconductor memories that requires a submicron patterning with a high throughput.

SUMMARY OF THE INVENTION

Accordingly, it is a general object of the present invention to provide a novel and useful electron beam exposure system wherein the foregoing problems are eliminated.

Another object of the present invention is to provide an electron beam exposure system that has an electric interface element acting also as a seal element for interfacing electric connections between elements inside an evacuated column of the electron beam exposure system and external driving units provided outside the column, wherein the interface element has a reduced size and yet is capable of carrying an increased number of electric connections thereon.

Another object of the present invention is to provide an electron beam exposure system having an electric interface element, wherein the electric interface element includes a ceramic base body on which a number of conductor patterns are provided. Further, a seal layer having a smooth surface is provided on the ceramic base body to bury the conductor patterns. According to the present invention, a large number of electric interconnections can be secured between the elements inside the column of electron exposure system and external driving units, without increasing the size of the interface element. Thereby, one can supply various control signals to the elements inside the evacuated column.

Other objects and further features of the present invention will become apparent from the following detailed description when read in conjunction with the attached drawings.

DETAILED DESCRIPTION

Figure 1:
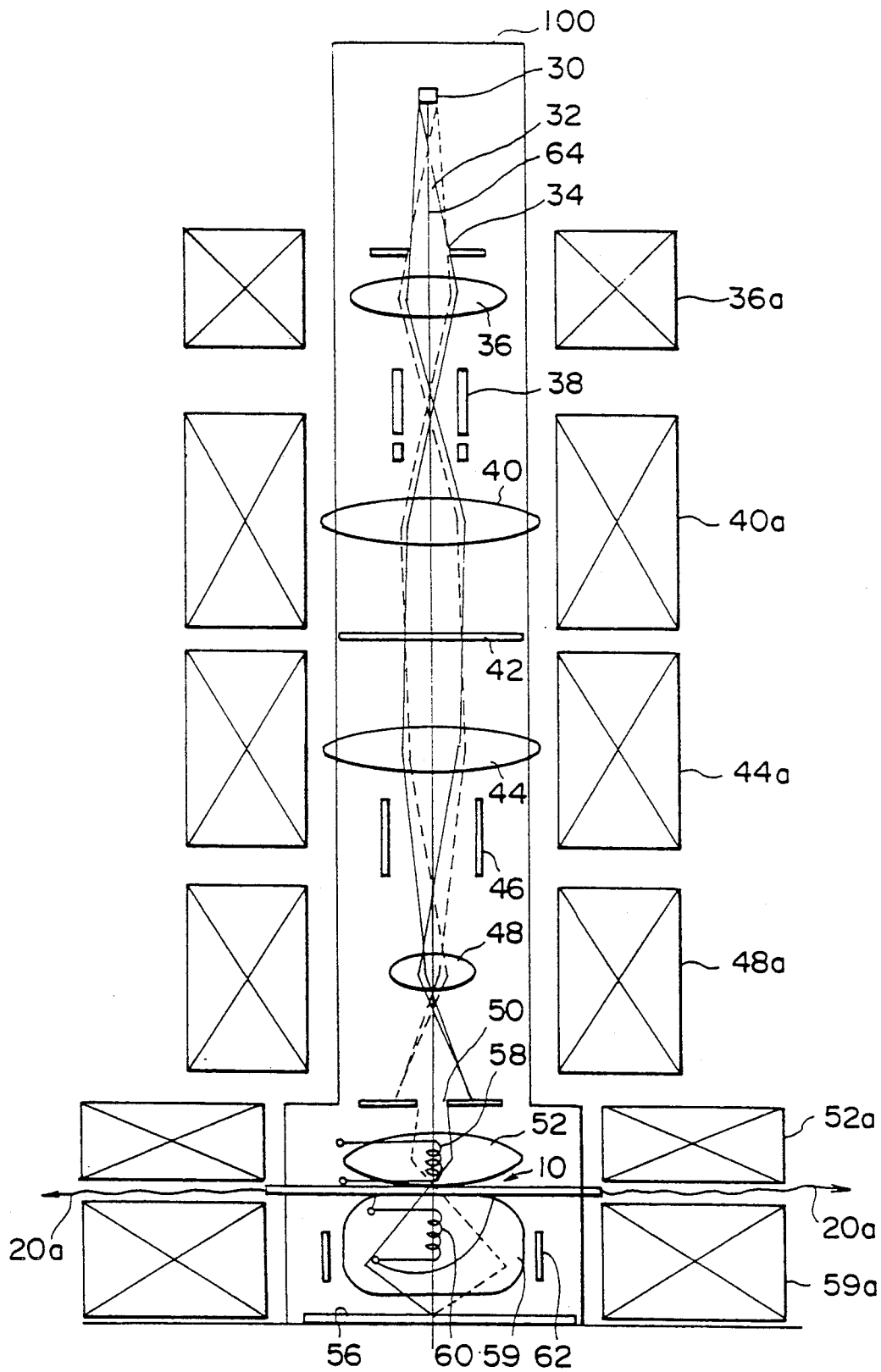
FIG. 1 is a diagram showing schematically the construction of a conventional electron beam exposure system.
Figure 6:
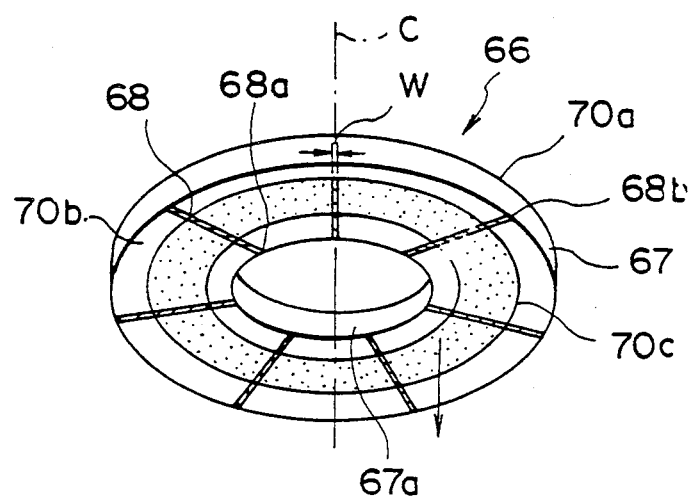
FIG. 6 is a perspective view showing the interface element according to a first embodiment of the present invention.

FIG. 6 shows an interface element 66 according to a first embodiment of the present invention for interfacing interconnections between elements inside the column 100 of the electron beam exposure system of FIG. 1 and the control unit (not shown) provided outside the column.

Referring to FIG. 6, the element 66 comprises a ring-shaped ceramic body 67 having a circular central opening 67a for passing the electron beam. The ceramic body 67 has upper and lower flat major surfaces 70a and 70b wherein only the lower major surface 70b can be seen in the perspective view of FIG. 6. The ceramic body 67 is made for example of dense sintered alumina ($Al_2O_3$) and provides a smooth surface for the upper and lower major surfaces 70a and 70b. The surfaces 70a and 70b provide a leakage free, hermetic sealing when the element 10 is mounted on the electron beam exposure system. The mounting of the element 66 on the electron beam exposure system will be described later. Typically, the thickness of the ceramic body 67 may be about 1 mm or less. The outer diameter of the body 67 may for example be 40 mm and the inner diameter of the central opening 67a may be 20 mm.

On the lower major surface 70b, a number of conductor patterns 68 are disposed radially about a hypothetical central axis C, and a ring-shaped insulator film 70c is provided concentrically to the axis C on the surface 70b to bury the conductor patterns 68 except for the inner end 68a and outer end 68b of each. The conductor pattern may typically has a thickness of several microns to several tens of microns. The width W of the pattern may be chosen as desired. The insulator film 70c may be made of a glass, resin or dense ceramic and has a smooth surface that provides a hermetic seal surface. The thickness of the film 70c may be about several microns to several tens of microns depending on the thickness of the conductor patterns 68.

Figure 7:
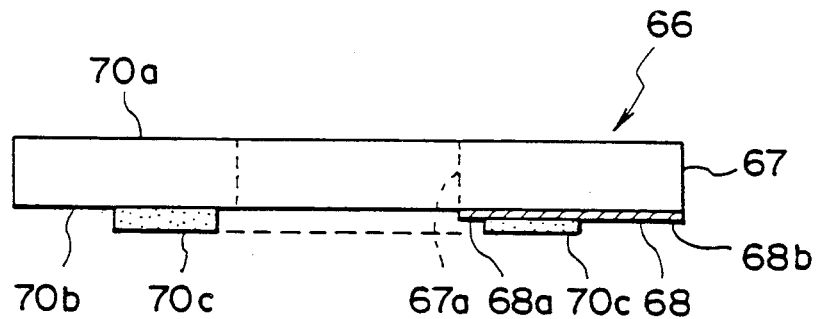
FIG. 7 is an elevational cross section of the interface element of FIG. 6.

FIG. 7 shows the radial cross section of the interface element 66. It will be seen that the insulator film 70c covers only the intermediate part of the conductor pattern 68. In other words, the innermost end 68a and the outermost end 68b of each conductor pattern 68 are exposed for external connection. The insulator film 70c has a top surface that is substantially on the same level irrespective of whether the film 70c is provided on the conductor pattern 68 or on the lower major surface 70b directly. As noted previously, the insulator film 70c may be made of glass, resin or ceramics wherein glass or resin is preferred. The process for providing such a film on the surface of a ceramic plate carrying thereon a conductor pattern is well established in the art of printed circuit board and further description will be omitted.

Figure 8:
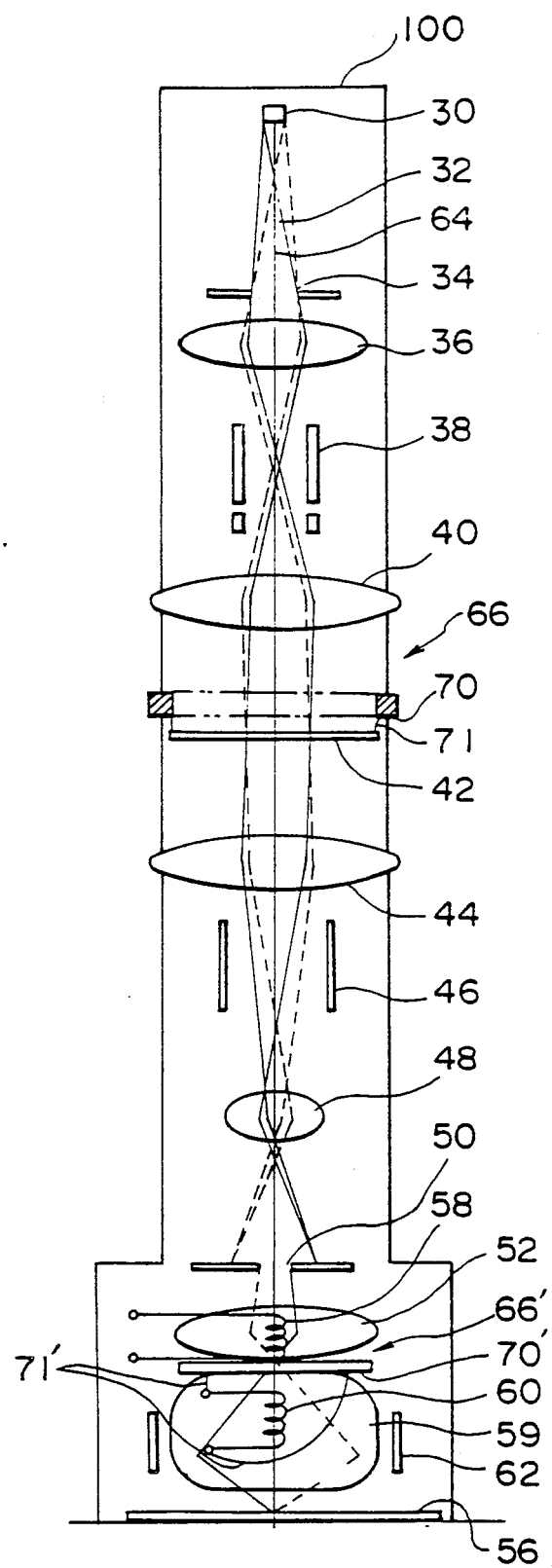
FIG. 8 is a schematic diagram showing the overall construction of the electron beam exposure system in which the element of FIG. 6 is used.

Next, the mounting of the interface element 66 on the electron beam exposure system will be described briefly with reference to FIGS. 8-10, wherein FIG. 8 shows the electron beam exposure system similar to the system of FIG. 1. For the sake of clarity of the drawing, the illustration of the coils for the electron lenses is omitted.

Referring to FIG. 8, the interface element 66 is provided on the column 100 at a part between the electron lens 40 and the electron lens 44 where the blanking aperture array 42 is provided. The conductor patterns 68 of the element 66 are connected to the electrodes of the blanking aperture array 42 by respective leads 71.

Figure 9:
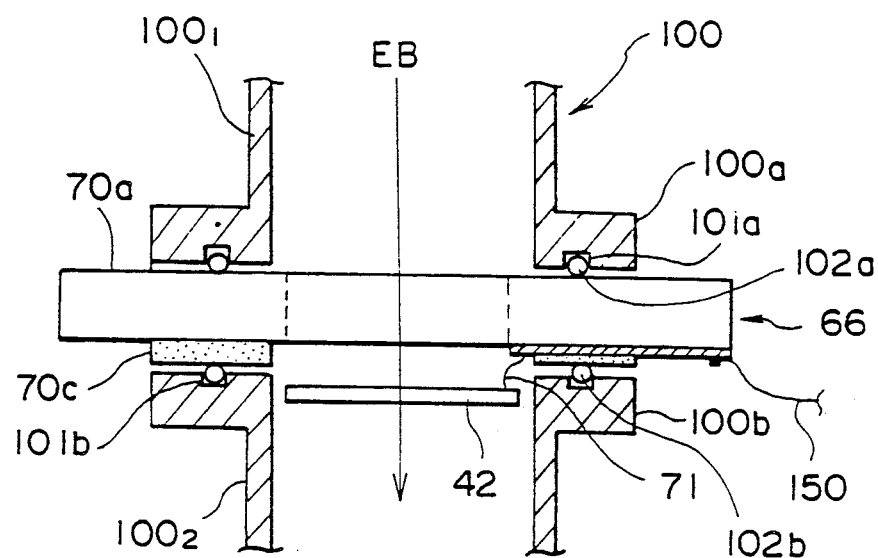
FIG. 9 is an enlarged view showing the part of FIG. 8 where the element of FIG. 6 is mounted on a column of the electron exposure system of FIG. 8.

FIG. 9 shows the mounting of the element 66 on the column 100 in some detail.

Referring to FIG. 9, the column 100 is divided into an upper body $100_1$ and a lower body $100_2$, wherein flange parts 100a and 100b are formed respectively in correspondence to the upper and lower bodies $100_1$ and $100_2$. The flange part 100a has a flange surface formed with a circular groove 101a in which a rubber seal ring 102a is placed. Similarly, the flange part 100b is formed with a circular groove 101b on its flange surface and a rubber seal ring 102b is placed in the groove 101b.

Figure 5:
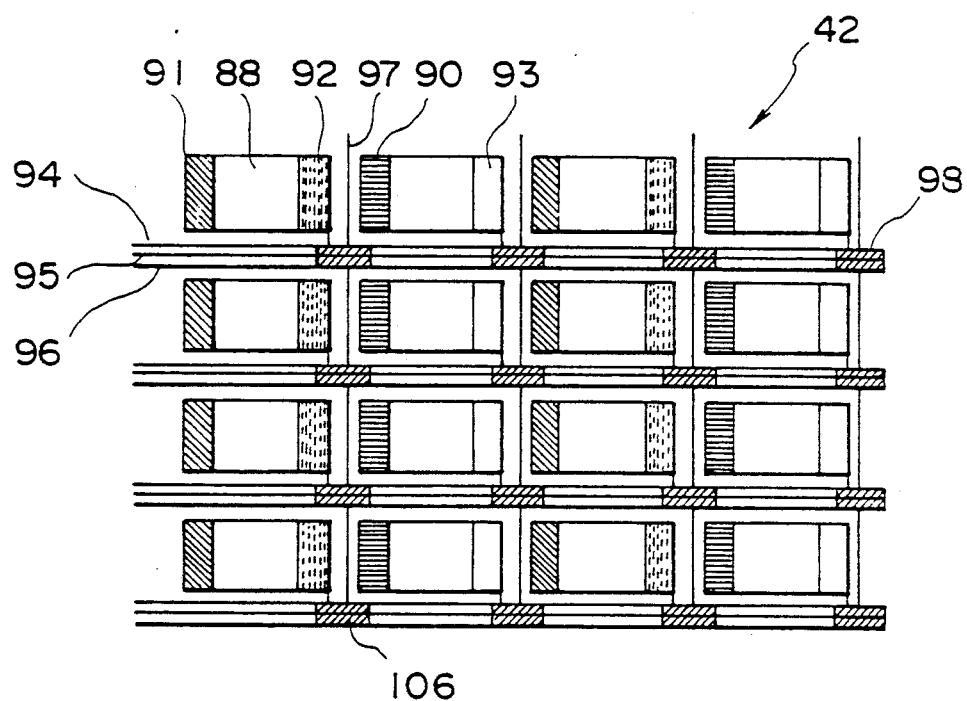
FIG. 5 is a diagram showing the blanking aperture array of FIG. 4 in an enlarged scale.

The interface element 66 is mounted on the flange surface of the flange part 100b such that the circular seal ring 102b makes an intimate contact with the surface of the ring-shaped insulator film 70c with a generally concentric relationship. Thereby, the central opening 67a agrees with the passage of the electron beam EB. Further, the exposed inner end 68a is connected to the corresponding conductor pattern of the blanking aperture array 42 such as the conductor pattern 94 of FIG. 5 by a lead wire 71. Further, the exposed outer end 68b of the conductor pattern 68 is connected to a lead 150 to the external drive unit not illustrated.

On the interface element 66 thus mounted on the lower part $100_2$ of the column 100, the upper part $100_1$ is mounted such that the seal ring 101a held on the flange part 100a makes a contact with the upper major surface 70a of the element 66. Alternatively, the flange surface of the flange part 100a may be made flat and thereby directly contact the smooth upper major surface 70a of the interface element 66. In any of these constructions, an excellent hermetic seal is established between the upper major surface 70a of the interface element 66 and the upper part $100_1$ of the column 100, and further between the surface of the insulator film 70c and the lower part $100_2$ of the column 100.

Figure 10:
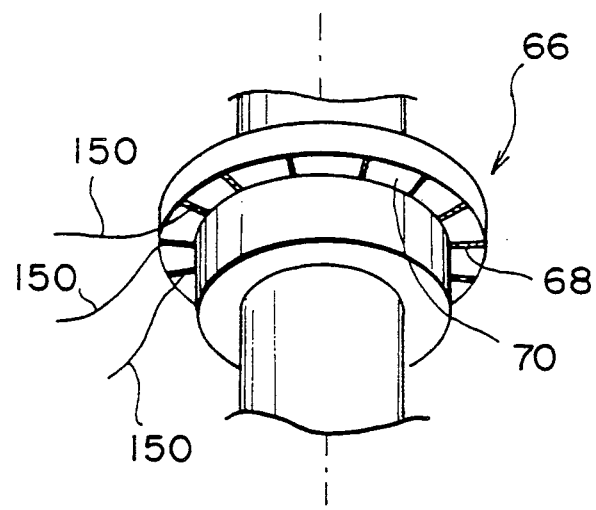
FIG. 10 is a perspective view showing the state that the element of FIG. 6 is mounted on the system of FIG. 8.

FIG. 10 shows the element 66 in the mounted state in the perspective view. As can be seen, the conductor patterns 68 are exposed at the lower major surface 70b of the interface element 66, and one can connect the leads 150 to the corresponding conductor patterns 68 without difficulty. Thereby, one can secure a large number of connections by providing a large number of patterns 68, and the driving of the electrodes of the apertures 88 in the blanking aperture array 42 is achieved without difficulty. When the width W of the conductor pattern 68 is set to about 10 $\mu$m, one obtains about 3000 or more of these conductor patterns for the element 66 that has the outer diameter of 40 mm and the inner diameter of 20 mm.

Figure 2:
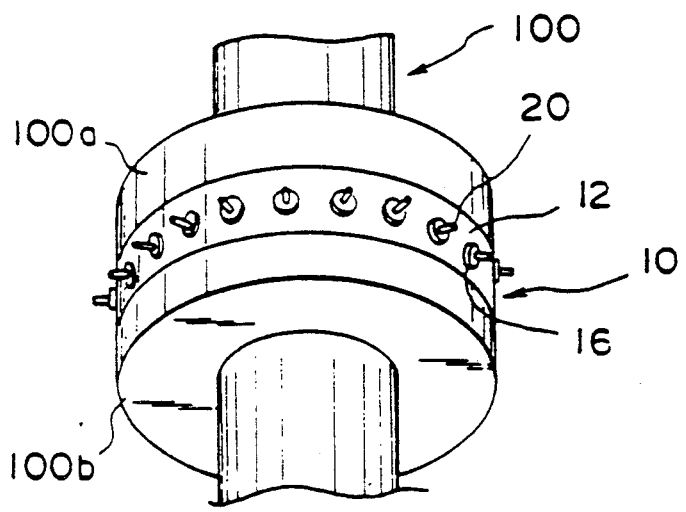
FIG. 2 is a perspective diagram showing an interface element used in the electron beam exposure system of FIG. 1.
Figure 3:
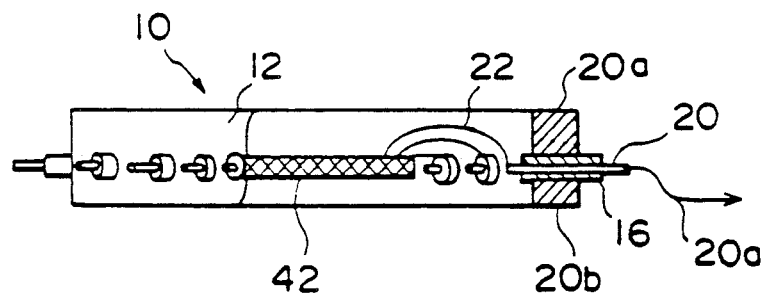
FIG. 3 is a side view showinq a partial cross section of the element of FIG. 2.
Figure 4:
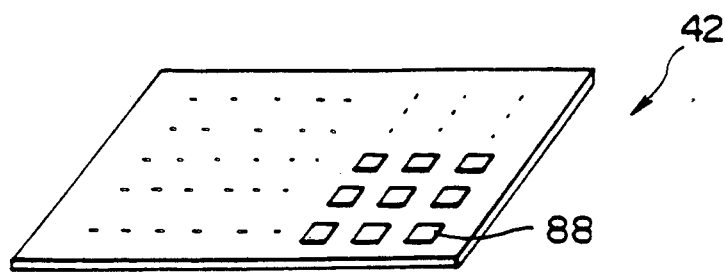
FIG. 4 is a perspective diagram showing a blanking aperture array used in the system of FIG. 1.

It should be noted that the interface element 66 has a thickness of about 1 mm or less that is mainly determined by the thickness of the ceramic body 67 forming the base of the element 66. Thus, the mounting of the element 66 between the lens 40 and the lens 44 does not cause any substantial problem of increased distance between these lenses and hence any problem as to the focal length of the lens. In other words, the problem of degraded resolution and aberrations hitherto occurring when the conventional interface element 10 of FIG. 2 is used, is successfully eliminated by the interface element 66 of the present invention.

Next, a second embodiment of the present invention will be described with reference to FIGS. 11-13.

Figure 11:
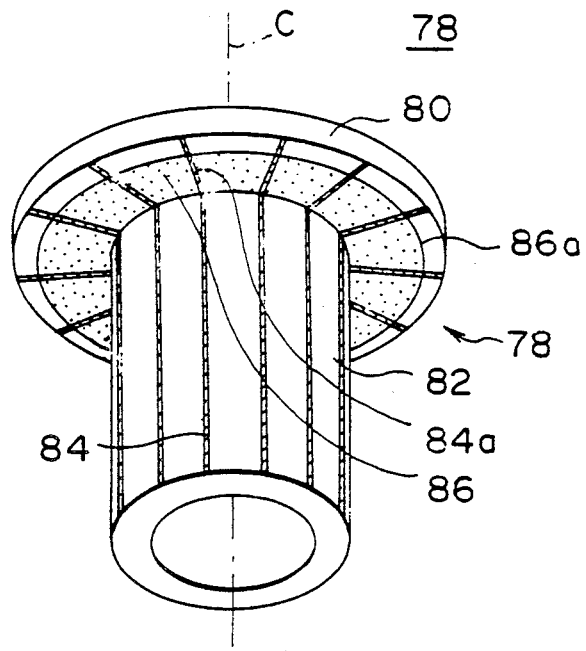
FIG. 11 is a perspective view showing the interface element according to a second embodiment of the present invention.

Referring to FIG. 11 showing an interface element 78 of a second embodiment, the element 78 includes a circular flange part 80 and a cylindrical part 82 that extends from the flange part 80 along a hypothetical central axis C of the circular flange part 80. On the outer wall of the cylindrical part 82, a number of conductor patterns 84 are provided to extend in the direction of the axis C, and each conductor pattern 84 forms a radial conductor part 84a that extends radially about the axis C along a lower surface 86 of the flange part 80. The element 78 is made hollow such that the electron beam can pass through the flange part 80 and the cylindrical part 82 generally along the axis C.

On the lower surface 86, there is provided a ring-shaped insulator film 86a of glass or resin such that the film 86a covers the radial conductor part 84a of each conductor pattern 84. The insulator film 86a forms a smooth, flat surface irrespective of whether the film 86a is formed directly on the surface 86 or the film 86a buries the conductor pattern 84a underneath. On the other hand, the conductor patterns 84 on the outer wall of the cylindrical part 82 are exposed. Similarly to the case of the previous embodiment, the circular flange part 80 has a thickness of about 1 mm. Further, the thickness of the insulator film 86a and the thickness of the conductor pattern 84 are determined similar to the first embodiment.

Figure 12:
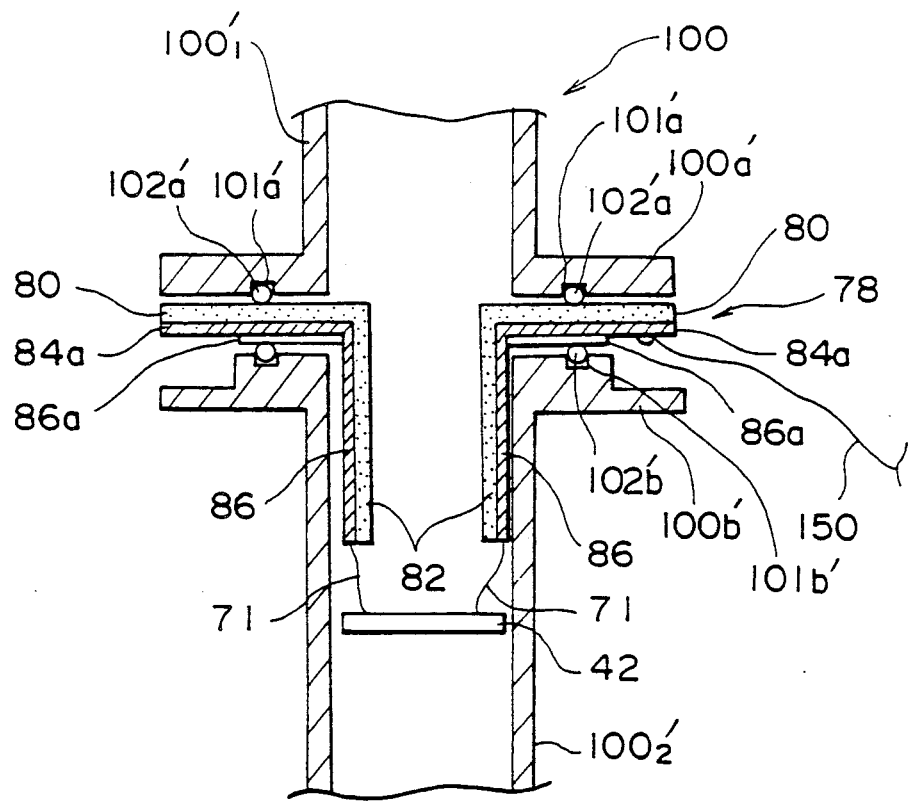
FIG. 12 is an enlarged cross section showing the mounting of the interface element of FIG. 11 on the electron beam exposure system.

FIG. 12 shows the mounting of the interface element 78 on the electron beam exposure system of FIG. 8.

This drawing shows only the part that is related to the disclosure of the second embodiment.

Referring to FIG. 12, the column 100 is divided into a first part $100_1'$ and a second part $100_2'$ respectively corresponding to the first part $100_1$ and the second part $100_2$ of FIG. 9. The first part $100_1'$ carries a flange part $100a'$ corresponding to the flange part $100a$, the second part $100_2'$ carries a flange part $100b'$ corresponding to the flange part $100b$, wherein the flange part $100a'$ is formed with a circular groove $101a'$ that holds a seal ring $102a'$ corresponding to the seal ring $102a$. Similarly, the flange part $100b'$ is formed with a circular groove $101b'$ that holds a seal ring $102b'$. Upon mounting of the interface element 78 on the lower, second part $100_2'$ of the column 100, the smooth surface of the insulator film $101b'$ engages with the seal ring $102b'$ and establishes an intimate contact therebetween. Further, the seal ring $102a'$ of the first part $100_1'$ makes an engagement with the upper surface of the flange part 80 of the element 78. This upper surface of the flange part 80 is also made smooth and flat and thereby the seal ring $102a'$ establishes an intimate contact with the upper surface of the flange part 80.

The interconnection to the external drive unit is achieved by connecting the interconnection wire 150 to the exposed part of the conductor pattern 84a at the lower surface of the flange part 80. Further, the interconnection to the blanking aperture array 42 is established by connecting the conductor patterns 86 on the outer wall of the cylindrical part 82 to the array 42 by the respective leads 71.

In this embodiment, too, the foregoing various advantages of the present invention, including the reduction of space needed for mounting the interface element 78, reduction of the distance between adjacent electron lenses across the element 78, and affording a large number of interconnections for driving the blanking aperture array, are achieved.

Figure 13:
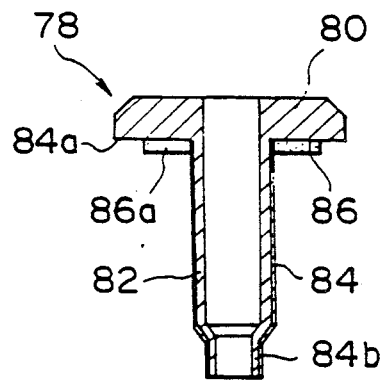
FIG. 13 is a cross sectional view showing a modification of the element of FIG. 11 in an elevational cross section.
Figure 14:
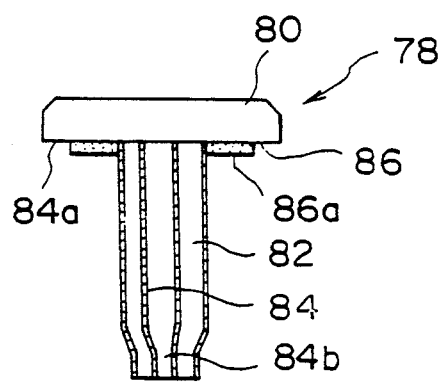
FIG. 14 is a side view showing the element of FIG. 13.

FIGS. 13 and 14 show a modification of the second embodiment respectively in a cross sectional view and a side view. In this modification, a reduced diameter part is formed in the cylindrical part 82 in the lowermost end thereof, and a terminal part 84b is formed in the conductor pattern 84 in correspondence to the reduced diameter part. As the rest of the feature for this modification is substantially identical with the second embodiment, further description will be omitted.

Figure 15:
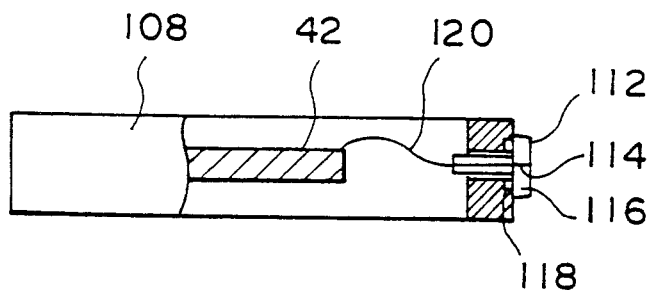
FIG. 15 is a schematic diagram showing a modification of the interface element of FIG. 11.

FIG. 15 shows another modification of the interface element of the second embodiment. In this modification, a ring-shaped spacer element 108 is interposed between the upper and lower parts $100_1'$ and $100_2'$ of the column 100 such that the inside of the element 108 is maintained in the vacuum state. In this case, the element 108 has a substantial thickness e.g. of 20-30 mm, and includes a hollow space therein for accommodating the blanking aperture array 42. Further, a number of radial holes are formed on the side wall of the element 108, and a ceramic plug 112 is inserted into each hole as illustrated.

Figure 16:
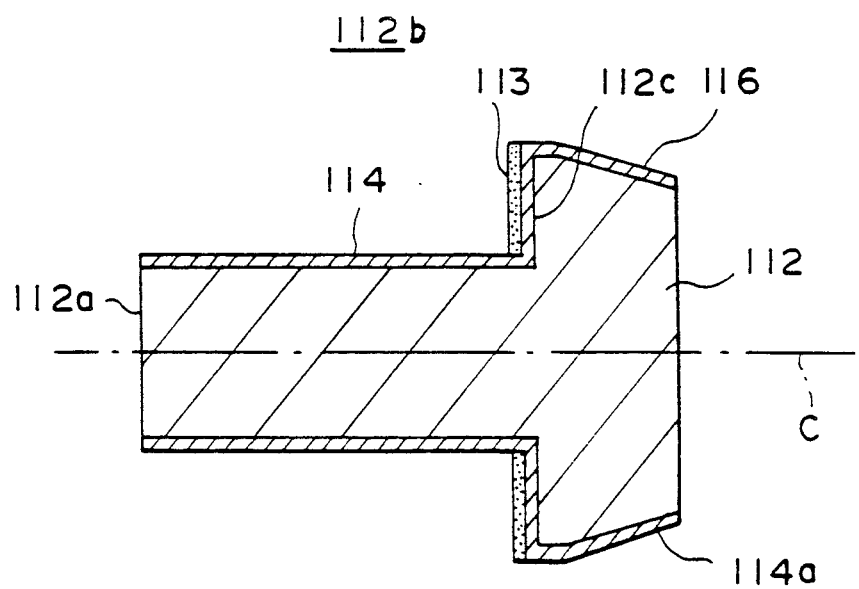
FIG. 16 is an enlarged cross sectional view showing the interface element of FIG. 15.

FIG. 16 shows an enlarged view of the plug 112. Referring to FIG. 16, the plug 112 has a cylindrical base part 112a and a head part 112 of truncated cone. The plug 112 is formed generally symmetric about a hypothetical central axis C, and a number of conductor patterns 114 are arranged on the surface of the cylindrical part 112a along the circumferential direction such that each pattern 114 extends in the direction of the axis C somewhat similar to the element of FIG. 11. The conductor pattern 114 further extends along a rear surface 112c of the head part 112b and reaches a side wall 116 of the head part 112b where the conductor pattern 114 forms an interconnection region 114a used for external connection. Further, there is provided an insulating film 113 of glass, resin or ceramics in correspondence to the rear surface 112c such that the film 113 buries the conductor pattern 114 in correspondence to the rear surface 112c.

Referring to FIG. 15 again, the plug is inserted into the hole with a seal ring 118 intervening between the element 108 and the head part 112c. The seal ring 118 surrounds the base part 112a and establishes an intimate contact with the insulator film 113 when the plug 112 is mounted. As each plug 112 carries a number of conductor patterns, a number of interconnection paths are formed on the plug 112 in correspondence to the number of conductors 114 that extend from the inside of the element 108 to the outside thereof. By providing a large number of plugs 112 and connecting the conductor patterns 114 to the blanking aperture array 42 via respective interconnection wires 120 as illustrated in FIG. 15, one can provide sufficient interconnection paths for supplying control signals to the blanking aperture array 42.

Further, the present invention is not limited to the embodiments described heretofore, but various variations and modifications may be made without departing from the scope of the invention.

What is claimed:

1. An electron beam exposure system for writing a pattern on an object by an electron beam, comprising:
   beam source means for producing an electron beam and emitting the electron beam along a predetermined optical path;
   beam focusing means, provided along the optical axis between the beam source means and the object, for focusing the electron beam on the object;
   beam processing means, provided along the optical axis between the beam source means and the object and supplied with control signals, for modifying the electron beam in response to the control signals;
   column means, extending along the optical axis, for surrounding a region that includes the object, the beam source means, the beam focusing means and the beam processing means and maintaining said region evacuated;
   interface means, mounted on the column means, for supplying said control signals to said beam processing means;
   said column means comprising at least a first part and a second part and holding the interface means between the first and second parts with an hermetic seal established therebetween;
   said interface means comprising a ring-shaped base body of a ceramic material, said base body having a first major surface and a second, opposing major surface and being defined by an outer circumferential periphery and an inner circumferential periphery, said first major surface forming a flange surface for establishing an hermetic seal with the first part of the column means, one or more conductor patterns provided on the second major surface and extending from the inner circumferential periphery to the outer circumferential periphery, and an insulator film provided on the second major surface of the base body and burying the conductor patterns thereunder, said insulator film having a substantially flat major surface that establishes an hermetic seal with the second part of the column means.

2. An electron beam exposure system as claimed in claim 1 in which said insulator film is configured so as to expose an outer end and an inner end of each of the conductor patterns in correspondence to the respective outer and inner circumferential peripheries of the base body.

3. An electron beam exposure system as claimed in claim 1 in which said conductor patterns extend in a radial direction on the ring-shaped base body.

4. An electron beam exposure system as claimed in claim 1 in which said insulator film has a ring shaped form defined by an outer circumferential periphery and an inner circumferential periphery that are generally concentric with the outer and inner circumferential peripheries of the base body.

5. An electron beam exposure system as claimed in claim 4 in which said second part of the column means includes an elastic seal ring that establishes an intimate contact with the surface of the insulator film.

6. An electron beam exposure system as claimed in claim 5 in which said second part of the column means includes a flange part forming a flange surface that is substantially parallel to the second major surface of the base body, said flange surface being formed with a groove for accommodating the elastic seal ring.

7. An electron beam exposure system as claimed in claim 6 in which said flange part has a ring shaped form with an outer diameter which is smaller than an outer diameter of the ring-shaped base body, so that the outer end of each of the conductor patterns on the base body is exposed for external connection.

8. An electron beam exposure system as claimed in claim 1 in which said interface means further comprises a cylindrical body of a ceramic material extending from the inner circumferential periphery of the ring-shaped base body as a continuation thereof and in a direction substantially perpendicular to the second major surface, said cylindrical body having a hollow inner space formed therein for passing the electron beam therethrough and an outer cylindrical wall, said outer cylindrical wall carrying thereon one or more conductor patterns extending as a continuation of the inner ends of the respective conductor patterns provided on the second major surface of the base body.

9. An electron beam exposure system as claimed in claim 8 in which said cylindrical body is formed with a part having a reduced diameter in correspondence to an end thereof which is remote from the inner circumferential periphery of the base body.

10. An electron beam exposure system for writing a pattern on an object by an electron beam, comprising:
    beam source means for producing an electron beam and emitting the electron beam along a predetermined optical path;
    beam focusing means, provided along the optical axis between the beam source means and the object, for focusing the electron beam on the object;
    beam processing means, provided along the optical axis between the beam source means and the object and supplied with control signals, for modifying the electron beam in response to the control signals;
    column means, extending along the optical axis, for surrounding a region that includes the object, the beam source means, the beam focusing means and the beam processing means and maintaining said region evacuated; and
    interface means, mounted on the column means, for supplying said control signals to said beam processing means;
    said column means being provided with one or more openings penetrating therethrough; and
    one or more plugs being plugged into corresponding said one or more openings with an hermetic seal established between each said plug and the column means;
    each of said plugs comprising a ceramic body and including a cylindrical base part having a first diameter and a disc-shaped head part having a second, larger diameter, said cylindrical base part and said disc-shaped head part being formed as a unitary body, said cylindrical base part having a cylindrical outer surface and said head part having a ring-shaped rear surface that extends radially from the cylindrical outer surface of the base part and a side surface that extends to the ring-shaped rear surface and surrounds the head part around the circumference of the head part;
    each of said plugs further carrying one or more conductor strips which extend on the cylindrical part in the axial direction of the cylindrical part, said conductor strips extending further in a radial direction along the ring-shaped rear surface of the had part and reaching the side surface;
    each of said plugs further carrying an insulating film on the ring-shaped rare surface such that the insulating film buries the conductor pattern thereunder, said insulating film having a substantially flat major surface for establishing an hermetic seal with the column means when the plugs are mounted on the column means.

* * * * *

UNITED STATES PATENT AND TRADEMARK OFFICE
CERTIFICATE OF CORRECTION

PATENT NO. : 5,117,117
DATED : May 26, 1992
INVENTOR(S) : Yoshihisa OAE et al.

It is certified that error appears in the above-identified patent and that said Letters Patent is hereby corrected as shown below:

FRONT PAGE, under [57] "Inventors:", change "Kanagawa" to --Kawasaki--.

Col. 1, line 19, change "team" to --beam--;
line 60, delete "a".

Col. 5, line 7, change "has" to --have--.

Col. 7, line 54, after "thickness" insert --,--.

Col. 9, line 13, change "ring shaped" to --ring-shaped--.

Col. 10, line 44, change "had" to --head--;
line 47, change "rare" to --rear--.

Signed and Sealed this

Eighth Day of March, 1994

BRUCE LEHMAN

Attest:

Attesting Officer

Commissioner of Patents and Trademarks